US009524883B2

(12) United States Patent
Woychik et al.

(10) Patent No.: US 9,524,883 B2
(45) Date of Patent: Dec. 20, 2016

(54) HOLDING OF INTERPOSERS AND OTHER MICROELECTRONIC WORKPIECES IN POSITION DURING ASSEMBLY AND OTHER PROCESSING

(71) Applicant: Invensas Corporation, San Jose, CA (US)

(72) Inventors: Charles G. Woychik, San Jose, CA (US); Eric S. Tosaya, Fremont, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/535,159

(22) Filed: Nov. 6, 2014

(65) Prior Publication Data

US 2015/0333049 A1    Nov. 19, 2015

Related U.S. Application Data

(60) Provisional application No. 61/992,653, filed on May 13, 2014.

(51) Int. Cl.
*H01L 21/48* (2006.01)
*H01L 25/00* (2006.01)
(Continued)

(52) U.S. Cl.
CPC ....... *H01L 21/4853* (2013.01); *H01L 21/6831* (2013.01); *H01L 21/6838* (2013.01); *H01L 23/13* (2013.01); *H01L 23/49811* (2013.01); *H01L 23/49816* (2013.01); *H01L 23/49827* (2013.01); *H01L 25/00* (2013.01); *H01L 25/065* (2013.01); *H01L 25/0655* (2013.01); *H01L 25/50* (2013.01); *H01L 2224/16225* (2013.01);
(Continued)

(58) Field of Classification Search
CPC ...... H01L 25/00; H01L 25/065; H01L 25/043; H01L 25/0753; H01L 25/0756; H01L 25/115; H01L 25/117; H01L 21/683; H01L 21/6838; H01L 24/97; H01L 2224/97
See application file for complete search history.

(56) References Cited

U.S. PATENT DOCUMENTS 5,853,517 A    12/1998  Petefish et al.
7,960,840 B2    6/2011  Bonifield et al.
(Continued)

OTHER PUBLICATIONS

Machine English Translation of JP 6-18191, Kobayashi, published Mar. 9, 1994.*
(Continued)

*Primary Examiner* — Peniel M Gumedzoe
(74) *Attorney, Agent, or Firm* — Haynes and Boone, LLP

(57) ABSTRACT

A workpiece (120) has protruding conductive features (140) at least on a first side. The second side is processed while the workpiece is held from the first side by a holder (220H). To prevent damage to the protruding features and flatten the workpiece (which could be otherwise warped), a spacer (210) is inserted between the workpiece and the holder. The spacer has holes (250) receiving the protruding features. The workpiece can be held by forces generated by the holder such as vacuum or an electrostatic force, without an adhesive. Other features and advantages are provided.

19 Claims, 7 Drawing Sheets

(51) Int. Cl.
  *H01L 25/065* (2006.01)
  *H01L 21/683* (2006.01)
  *H01L 23/13* (2006.01)
  *H01L 23/498* (2006.01)

(52) U.S. Cl.
  CPC ............... *H01L 2224/32225* (2013.01); *H01L 2224/73204* (2013.01); *H01L 2924/15174* (2013.01); *H01L 2924/15192* (2013.01); *H01L 2924/15311* (2013.01); *H01L 2924/16152* (2013.01); *H01L 2924/16195* (2013.01)

(56) References Cited

U.S. PATENT DOCUMENTS

| | | |
|---|---|---|
| 8,273,603 B2 | 9/2012 | Racz et al. |
| 2004/0209542 A1 | 10/2004 | Ishida |
| 2012/0309187 A1 | 12/2012 | Sri-Jayantha et al. |
| 2014/0048951 A1 | 2/2014 | Lin et al. |
| 2014/0103499 A1 | 4/2014 | Andry et al. |

OTHER PUBLICATIONS

Professional English Translation of JP 6-18191, Kobayashi, published Mar. 9, 1994.*
JP 6-18191, Kobayashi, published Mar. 9, 1994.*
M. Yoo, "3D IC Technology—OSAT Perspective", Amkor Technology Taiwan, SiP Global Summit 2012.
J. Greenwood, "Back Side Integration and Supply Chain Challenges", SEMICON West 2011—3D in the Deep Submicron Era, Jul. 13, 2011.

* cited by examiner

HOLDING OF INTERPOSERS AND OTHER MICROELECTRONIC WORKPIECES IN POSITION DURING ASSEMBLY AND OTHER PROCESSING

CROSS REFERENCE TO RELATED APPLICATIONS

The present application claims priority of U.S. provisional patent application No. 61/992,653, filed May 13, 2014, incorporated herein by reference.

BACKGROUND OF THE INVENTION

The present invention relates to integrated circuits, and more particularly to fabrication of microelectronic assemblies that include integrated circuits, interconnect substrates, and possibly other components.

Integrated circuits (ICs) are fragile devices assembled and interconnected to form preferably small, inexpensive, reliable assemblies with densely packed circuitry. The ICs can be interconnected through intermediate substrates such as printed circuit boards (PCBs) or interposers. Such assemblies often involve hybrid technologies: a highly precise, semiconductor technology is used to form densely packed ICs in semiconductor substrates; while coarser and cheaper technology is used to form PCBs in ceramic, glass or organic substrates. Each technology requires its own equipment and expertise, sometimes obtained through cooperation of different manufacturers.

FIG. 1 shows an exemplary assembly (exploded view) with two die 110, an interposer (ITP) 120 and a PCB 130. Each die 110 is a semiconductor IC formed initially in a semiconductor wafer (not shown) and later separated from the wafer. The die have contact pads 110C attached to the interposer's contact pads 120C.T (e.g. by a thin solder layer, not shown, formed on pads 110C or 120C.T). The interposer has bottom contact pads 120C.B attached to contact pads 130C of PCB 130, e.g. by larger solder balls 140. The interposer's interconnect lines 120L interconnect contact pads 120C.T, 120C.B in a desired pattern. The PCB's interconnect lines 130L interconnect contact pads 130C. Since the PCB is made by coarser technology, the contact pads 130C cannot be as small and dense as the die's contact pads 110C, so interposer 120 "redistributes" the connections: the interposer is made in a silicon substrate by IC technology, and its top contact pads 120C.T match the die's contact pads, and the bottom contact pads 120C.B match the PCB's contact pads. (The interposer may perform other functions in addition to redistribution of the connections, e.g.: the interposer may absorb some of the thermal expansion differences between the PCB and the die, thus relieving the stress on the die's and PCB's contact pads; and may absorb some of the heat to prevent overheating (overheating is a common cause of IC assembly failure).)

The interposer should be thin in order to reduce the vertical extent (and hence the length) of interconnects 120L—reduced length reduces parasitic inductances and capacitances, and hence provides higher circuit speed and lower power consumption. 100 micron thickness has been reported for silicon interposers, and lower thickness are contemplated. However, a thin interposer is fragile and cannot absorb much heat during manufacturing. Also, a thin interposer is easily warped, making it difficult to attach the interposer to the PCB because the solder balls 140 are at different heights due to warpage. Therefore, interposers have been strengthened by means of a temporary "handle" wafer which is temporarily bonded to one side of the interposer (by an adhesive) while the other side of the interposer is processed to form suitable circuitry. The handle wafer is then debonded. Regrettably, bonding and debonding complicate the manufacturing, increasing the cost and reducing the yield, and requiring a careful selection of the bonding adhesive capable to withstand the processing conditions and then be easily dissolved in debonding (dissolving can be replaced by laser oblation for some adhesives); see e.g. U.S. Pat. No. 7,960,840 (Bonifield et al., Jun. 14, 2011). These complexities are clearly undesirable.

Another option is to manufacture an interposer 120 as a thin, top layer in a thick substrate, then attach the die to this layer, and then thin the substrate from the bottom side. Solder bumps 140 can be attached after thinning. Before thinning, the die can be encapsulated in a molding compound (e.g. epoxy resin) to strengthen the structure, keep the interposer flat (not warped), and aid in heat dissipation. Alternative techniques are desirable.

SUMMARY

This section summarizes some features of the invention. Other features may be described in the subsequent sections. The invention is defined by the appended claims, which are incorporated into this section by reference.

As noted above, IC assemblies may require hybrid technologies. In particular, die 110, interposer 120, and PCB 130 may require different equipment and expertise often provided by different manufacturers. Moreover, the final assembly—the attachment of die to the interposer and the interposer to the PCB—may require its own equipment and expertise. Given this hybridization, the manufacturing processes at different stages should preferably be independent from each other, so that each manufacturing stage—die fabrication, interposer fabrication, PCB fabrication, final assembly—can be performed without relying on equipment or expertise used at other stages. Suppose for example that die 110, interposer 120, and PCB 130 are each made by a different manufacture. (Even if both the interposer 120 and the die use IC fabrication technology, the interposer can be made by a different manufacturer because the interposer may require specialized equipment and expertise for making deep, densely-packed through-substrate vias (TSVs) that provide vertical segments of interconnects 120L.) The die-to-interposer attachment could be performed by still another party (such as OSAT, i.e. Outsourced Semiconductor Assembly and Test). The attachment of the die/interposer package to the PCB could be performed by OSAT or some other party which may attach additional components to the PCB. In this away, each manufacturer can develop expertise in a narrow area, and the company's manufacturing costs can be optimally spread among many customers for maximum capacity utilization.

Not every manufacturing sequence is conducive for such independence. Consider for example one manufacturing sequence described above in connection with FIG. 1: the interposer is made as a thin, top layer in a thick substrate, then the die are attached, and then the substrate is thinned from the bottom. The die attachment may be performed by an OSAT company, and the OSAT may have to ship the incomplete die/interposer assembly to the interposer manufacturer for thinning, or the OSAT may need to develop its own thinning expertise (which many OSATs currently do). This limits the manufacturing independence and flexibility and hence the customer choices and cost options. Therefore, reliable manufacturing techniques are needed to perform all the assembly steps after the interposer is thinned, and possibly even after the interposer has been bumped by solder 140. Manufacture of thin bumped interposers is a well-known, mature technology, but it needs better integration with the final assembly, preferably without using a handle wafer. (A handle wafer is generally undesirable as explained above, and especially so if the handle wafer has to be attached to the interposer side with solder 140 because such attachment can damage the solder bumps.)

Therefore, some embodiments of the present invention avoid the handle wafer complexity while still allowing a thin interposer to be held from the bumped side while attaching the die to the top. In particular, some embodiments use a specially crafted "spacer" which holds the interposer from the bumped side without adhesive and, in some embodiments, puts no pressure on the bumps, possibly does not even touch the bumps (touching or small pressure are possible in some embodiments). For example, the interposer can be held by vacuum or electrostatic forces, with the spacer transmitting the forces to the interposer. The spacer is easily separated from the interposer when the vacuum or other such forces are removed. Spacers can be used to hold the interposer from the top side if desired, during attachment or other manufacturing operations, e.g. interposer thinning or circuitry fabrication in the interposer.

In some embodiments, the spacer is made by known techniques as appropriate for the spacer material. If a semiconductor material is used, then masked etching or other techniques can be applied such as common in MEMS (Micro-Electro-Mechanical Systems). If a moldable material is used (e.g. plastic), the spacer can be made by molding. A spacer can include a laminate of different materials. These are non-limiting examples.

The invention is not limited to the known techniques or materials, or other features or advantages described above. In particular, the invention is not limited to silicon interposers; a spacer can be used with non-silicon interposers or with non-interposer substrates (e.g. with PCBs). Also, the invention is not limited to OSATs or any other business structure; the entire manufacturing process may be performed by a single manufacture for example. Further, a spacer can be used at stages other than the final assembly; for example, a spacer can be used before the interposer has been thinned or before some other steps in the interposer fabrication. Spacers can be used with handle wafers, or with manufacturing sequences that do not provide independence of different manufacturing stages. Other embodiments and variations are within the scope of the invention except as defined by the appended claims.

DESCRIPTION OF SOME EMBODIMENTS

The embodiments described in this section illustrate but do not limit the invention. The invention is defined by the appended claims.

Figure 1:
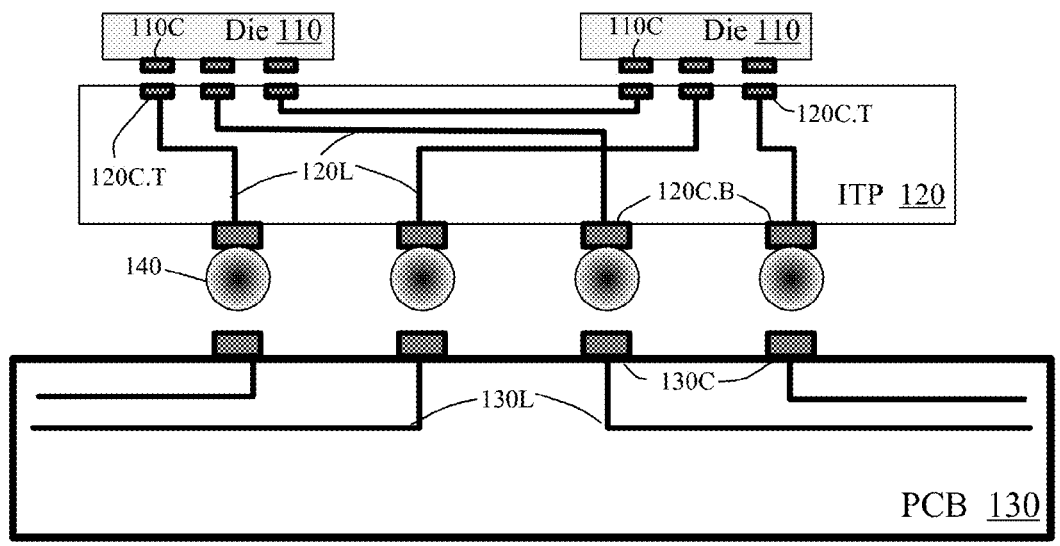
FIG. 1 is an exploded view of a vertical cross section of a microelectronic assembly according to prior art.
Figure 2A:
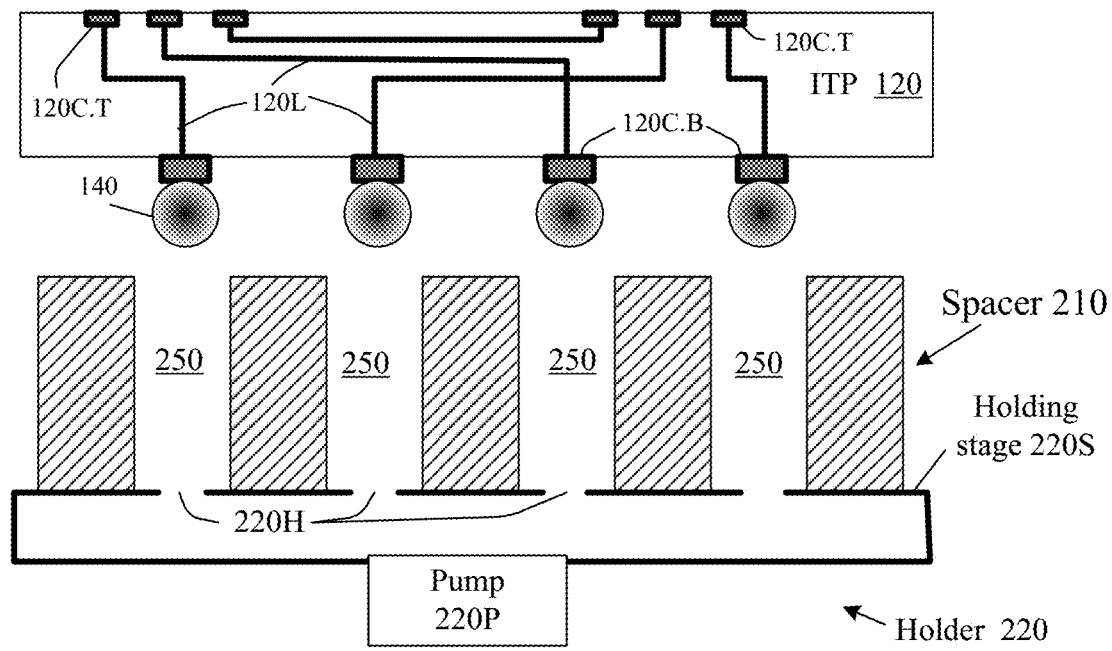
FIG. 2A is an exploded view of a vertical cross section of a microelectronic assembly in the process of fabrication according to some embodiments of the present invention.
Figure 2B:
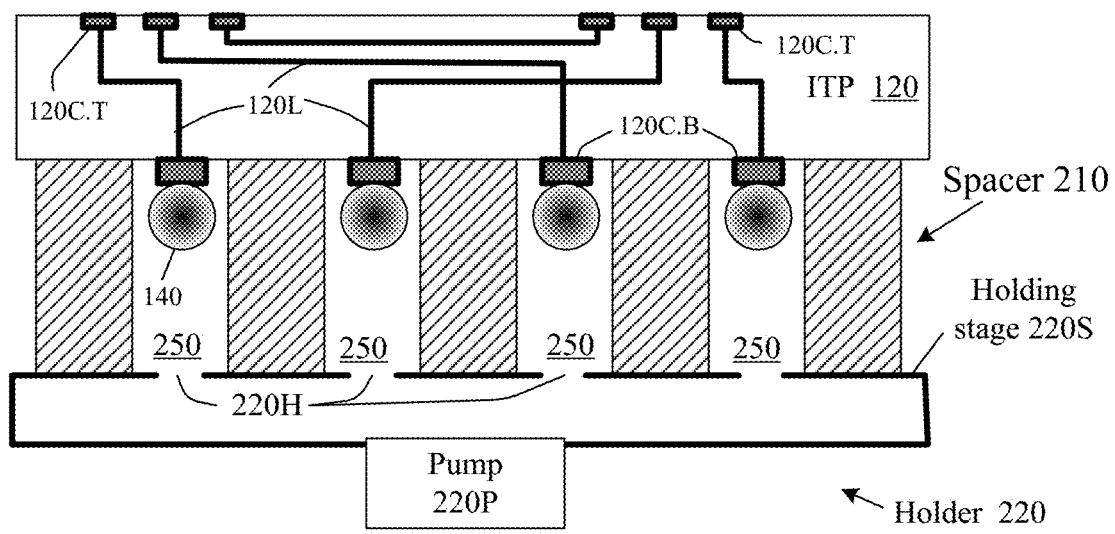
FIG. 2B shows a vertical cross section of a microelectronic assembly in the process of fabrication according to some embodiments of the present invention.
Figure 3:
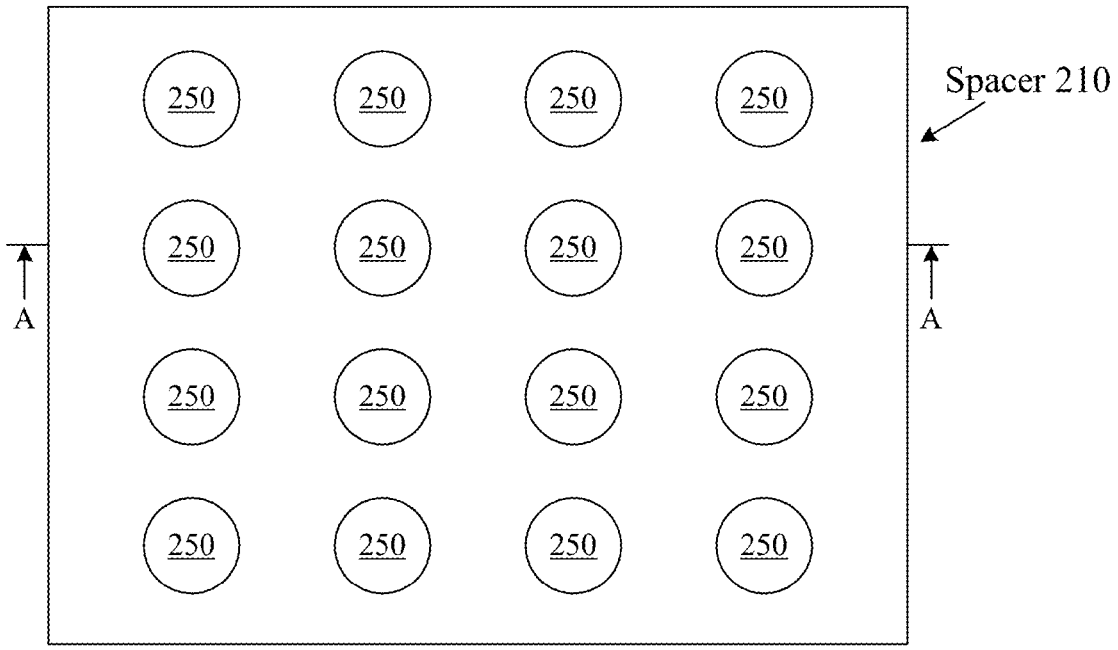
FIG. 3 is a top view of a spacer according to some embodiments of the present invention.

FIGS. 2A, 2B are vertical cross sections illustrating placement of an interposer 120 onto a spacer 210 according to some embodiments of the present invention. FIG. 2A is an exploded view, and FIG. 2B is the final interposer/spacer assembly. FIG. 3 is a top view of spacer 210. The cross-sectional plane of FIGS. 2A-2B is shown as A-A in FIG. 3. Interposer 120 is placed on spacer 210, which in turn is placed on a vacuum holder 220. In this example, interposer 120 has been manufactured to its final thickness and has been bumped with solder 140 (the interposer can be as in FIG. 1). This example is not limiting: for example, the interposer may or may not have been thinned to its final thickness, or may have some die or other modules already attached on top, or on the contrary the interposer may still need additional processing on the top side before die attachment.

Spacer 210 is a substrate with holes 250 that match the interposer's solder bumps 140. Each bump 140 enters the corresponding hole 250. FIG. 3 shows holes 250 arranged in an array, but the holes can be arranged in any pattern consistent with bumps 140. Any number of holes can be present.

Each hole 250 is a through-hole sized to accept a corresponding solder ball 140 without touching the ball. Alternatively, some touching may be present. In some embodiments, different balls may have different sizes in the same interposer, and different holes may have different sizes in the same spacer. Alternatively, all the holes may have the same size to fit the largest ball 140. Any combination of sizes is possible.

Vacuum holder 220 can be conventional. It has a holding stage 220S ("vacuum stage") that supports the spacer 210. Holes 220H in holding stage 220S communicate with spacer holes 250 and vacuum pump 220P. Vacuum pump 220P pumps the air or other gas in and out of holes 250 through holes 220H.

Figure 4:
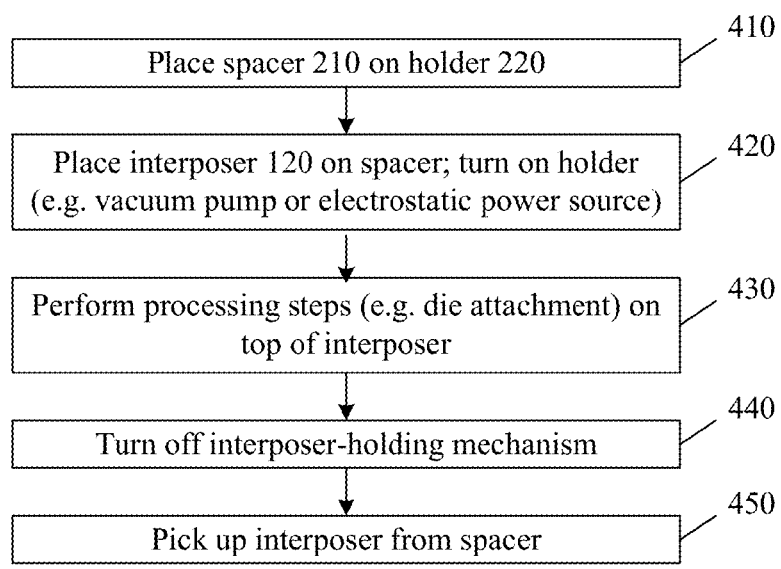
FIG. 4 is a flowchart of a manufacturing process according to some embodiments of the present invention.

FIG. 4 is an exemplary flowchart of interposer processing operations using the spacer 210. At step 410, spacer 210 is placed on holding stage 220S. At this step, before the interposer is placed on the spacer, the spacer can be held in position by gravity or a mechanical clamp (not shown) in holder 220, or by vacuum. In case of vacuum, holder 220 may include a conventional vacuum mechanism to hold the spacer when the spacer is not covered by an interposer. For example, the holding stage 220S may include additional holes (not shown) that do not communicate with holes 250 nor with holes 220H, and the vacuum can be created in these holes possibly by a separate pump (not shown). In another example, the spacer is held by the holder electrostatically. If the spacer includes a ferromagnetic material, then a magnet can be used to hold the spacer, e.g. an electromagnet (not shown) positioned below the holding stage 220S. Different mechanisms described above, and possibly other mechanisms, can be combined in a single holder to hold the spacer 210 in position regardless of interposer presence.

At step 420 (FIG. 4), interposer 120 is aligned with the spacer so that the bumps 140 are aligned with spacer holes 250. Interposer 120 is placed on the spacer so that the bumps 140 enter the corresponding holes 250. The interposer's bottom surface between the bumps 140 rests on spacer 210.

Figure 5:
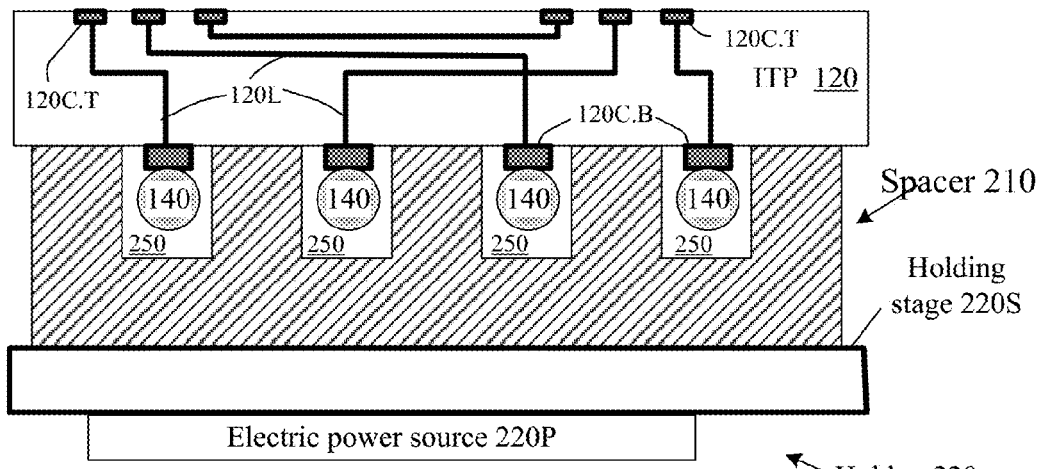
FIGS. 5 and 6A show vertical cross sections of microelectronic assemblies in the process of fabrication according to some embodiments of the present invention.

Before, during, or after the placement operation, holder 220 is activated to hold the interposer in position. (This activation is separate from activating the holder to hold the spacer at step 410.) For example, pump 220P is turned on to create negative pressure in spacer holes 250 and hold the interposer by vacuum. Holder 220 could also hold the interposer by a non-vacuum mechanism, e.g. electrostatically (even if the spacer is held by vacuum at step 410). If the interposer-holding mechanism is electrostatic, then the pump 220P is replaced by an electric power source (see FIG. 5) which can be turned on at step 420; the resulting electric field redistributes the charges in spacer 210 to hold the interposer 120. For example, spacer 210 can be a metal substrate with thin dielectric layers (not shown) on top and bottom to form two serially connected capacitors between the interposer and the holding stage 220S (other capacitor circuits can also be used, e.g. as in bipolar or other types of electrostatic chucks). Metal can be replaced by non-metal conductive materials. In still another example, spacer 210 is dielectric (e.g. plastic, such as epoxy resin or benzocyclobutene (BCB)); the entire spacer acts as a capacitor dielectric of an electrostatic chuck. In electrostatic embodiments, spacer holes 250 do not have to go through the spacer since no vacuum is needed to hold the interposer; holes 250 can be shallow as shown in FIG. 5. However, through-holes can be used even in electrostatic embodiments.

To emphasize, holder 220 may include two holding mechanisms: one mechanism (not shown) activated at step 410 to hold the spacer 210, and the other mechanism activated at step 420 to hold the interposer 120. Different kinds of mechanisms (vacuum, electrostatic, mechanical clamps, etc.) can be combined for each of these functions.

However, in some embodiments, holder 220 has only one mechanism, activated to hold the interposer; no separately activated mechanism can be provided to hold the spacer. The interposer-holding mechanism causes the interposer to press the spacer against the holding stage 220S.

At step 430, die 110 are attached to interposer 120, and/or other manufacturing steps are performed at the top of the interposer, as illustrated on some examples below.

At step 440, the holder 220 is operated to release the interposer. This can be done, for example, by turning off the vacuum pump 220P of FIGS. 2A-2B or the power source 220P of FIG. 5. The spacer may or may not be released at this stage.

At step 450, the interposer assembly (with the die and anything else that may be attached to the interposer) is separated from the spacer. The spacer itself may remain on holder 220 or be removed as desired.

Figure 6A:
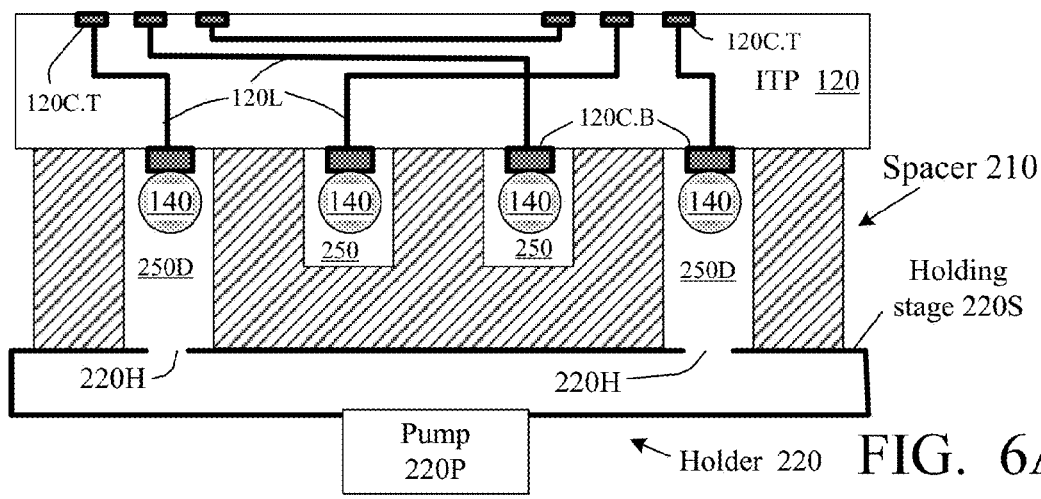
Figure 6B:
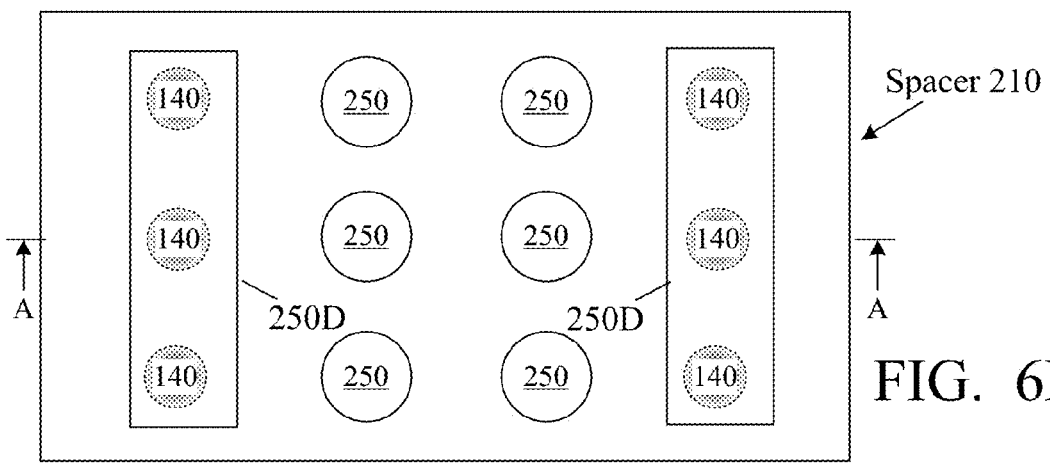
FIG. 6B is a top view of a spacer according to some embodiments of the present invention.

As shown in FIGS. 6A and 6B, a single hole 250 may accommodate (at least partially receive) multiple solder balls 140. These figures show a vacuum holder embodiment, but a similar feature can be provided in other embodiments, e.g. with an electrostatic holder as in FIG. 5. FIG. 6A shows a vertical cross section of spacer 210, interposer 120, and holder 220 along the cross-sectional plane A-A in FIG. 6B. FIG. 6B is a top view of the spacer, with some of solder balls 140 shown in dashed lined. Through-holes 250, marked as 250D, each accommodate three solder balls 140. The spacer also includes shallow holes 250 each of which contains only one solder ball 140. The interposer is held by vacuum delivered through the through-holes 250D. These holes are deeper than the shallow holes, and the deeper holes can be harder to make (e.g. if the holes are made by etching). Therefore, it can be easier to make the through-holes if they are wider. Hence, making the through-holes wider to accommodate more solder balls facilitates spacer fabrication. This also may facilitate aligning the interposer to the spacer at step 420.

Since the interposer is supported by the spacer areas between the holes 250, less support is provided if the holes 250 are wider. For example, in some embodiments, a spacer may have more holes 250 under the die 110 (FIG. 1) to provide more support for the interposer in the die areas or in the areas in which the electrical connections are made between the interposer and the die (these connection areas may be different from the die areas if, for example, the die are connected to the interposer by discrete wires); holes 250 can be wider in other areas.

Any hole 250 may accommodate any number of solder balls 140.

Figure 7:
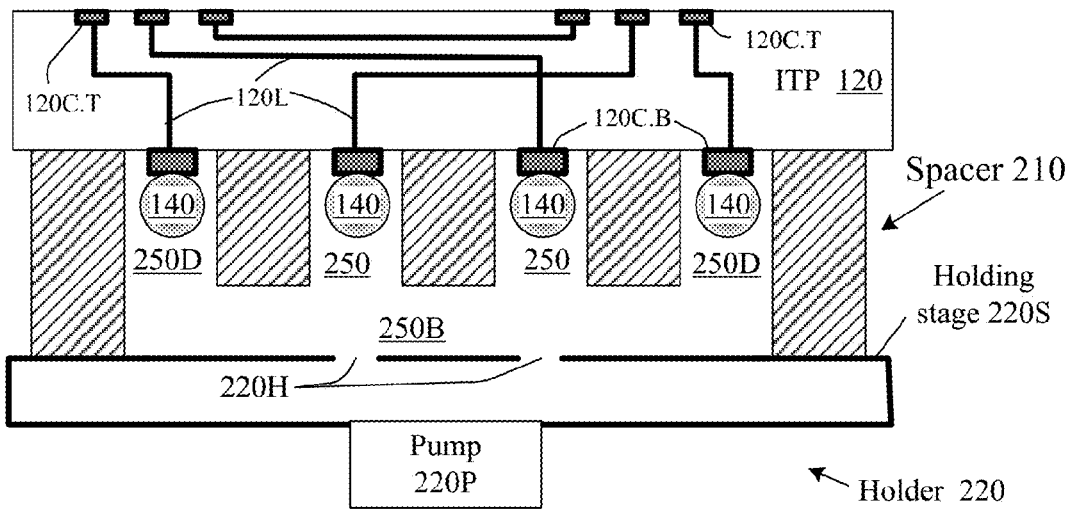
FIGS. 7, 8, 9A, 9B, 10A, 10B show vertical cross sections of microelectronic assemblies in the process of fabrication according to some embodiments of the present invention.

Many variations are possible in the spacer and holder construction. FIG. 7 shows another spacer 210 for use with a vacuum holder 220. Through-holes 250 communicate with each other, e.g. through the spacer's bottom area 250B, to equalize the gas pressure in the holes and provide more freedom for location and dimensions of vacuum holes 220H: holes 220H do not have to be aligned with the holes 250. The spacer's top view can be as in FIG. 3 or 6B for example.

In some embodiments, some holes 250 communicate with each other while other holes 250 do not. Thus, at least some holes 250 may be grouped into groups of communicating holes; the holes of each group communicate with each other, but there is no communication between the groups. Each group communicates with one or more holes 220H.

Figure 8:
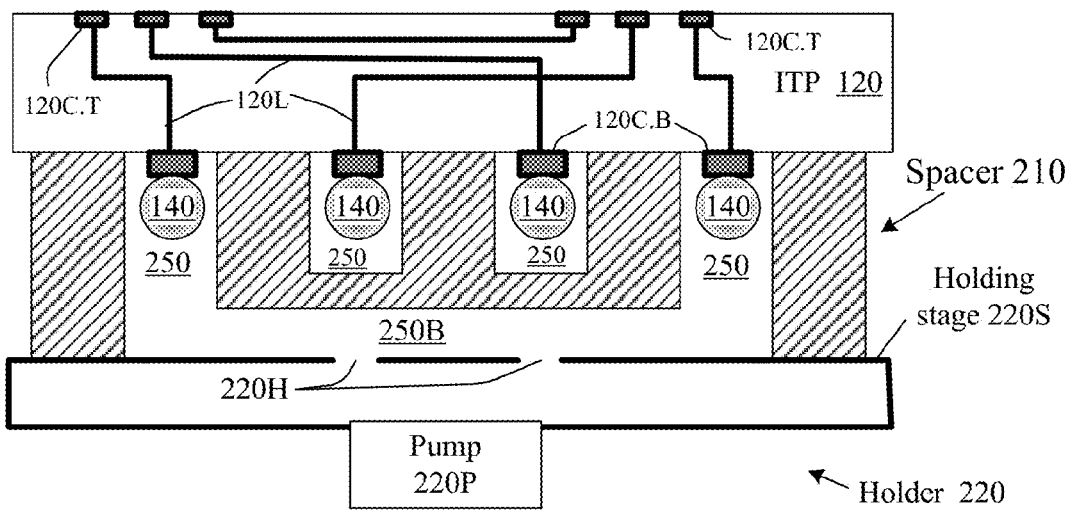

FIG. 8 shows another spacer 210 for use with a vacuum holder. This spacer combines the features of the spacers of FIGS. 6A and 7: some of the holes 250 are shallow (as in FIG. 5 or 6A); the other, deep holes 250D are through-holes that communicate with the holder's holes 220H. The through-holes 250D are communicate with each other through the spacer's bottom portion 250B as in FIG. 7. Any number of holes 250 can be shallow, and any holes 250 can be grouped into communicating groups as described above with respect to FIG. 7. Also, a hole 250 may accommodate multiple solder balls 140 as described above.

Communicating groups of holes 250 can also be used with electrostatic holders (i.e. holders that hold the interposer electrostatically; as noted above, such holders may or may not use non-electrostatic mechanisms to hold the spacer).

Figure 9A:
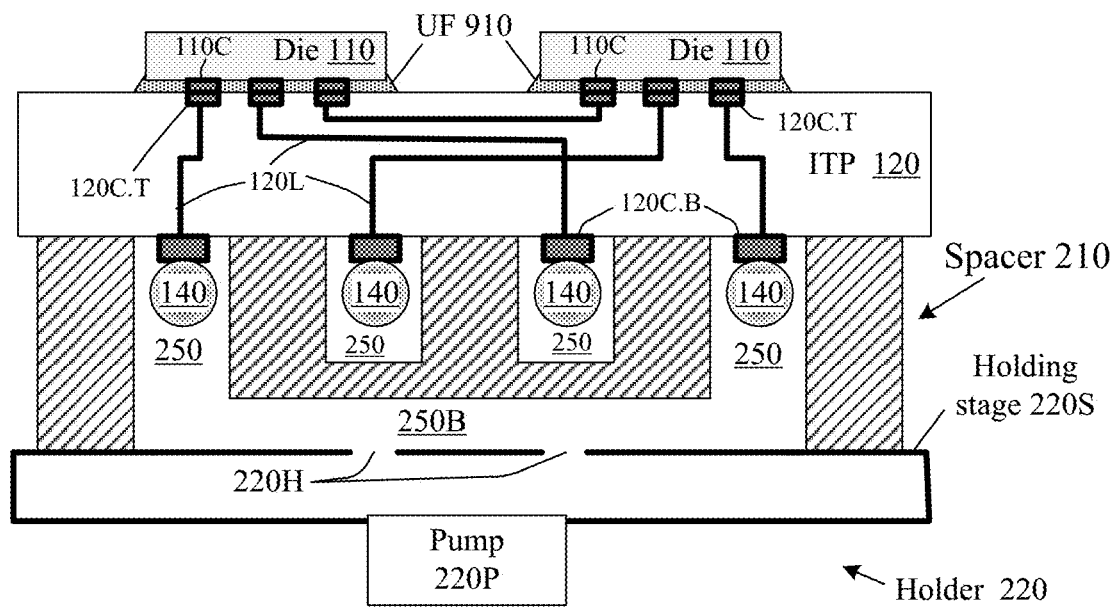
Figure 9B:
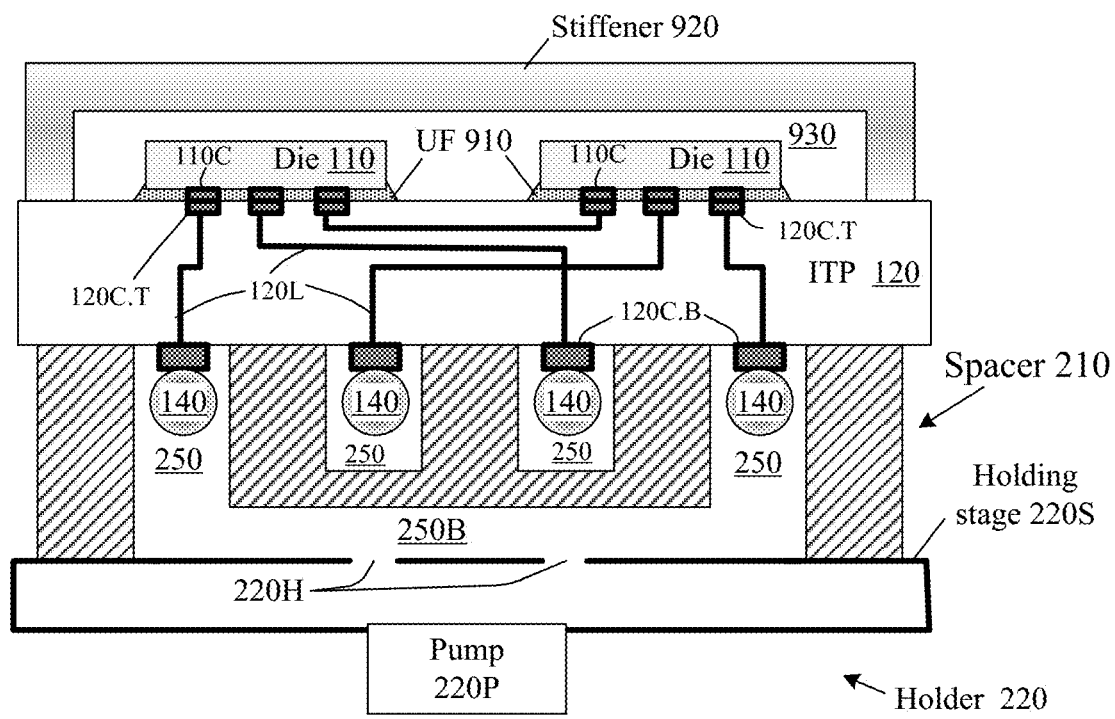

The interposer processing on the top side (at step 430 of FIG. 4) can be any kind consistent with the interposer, spacer, and holder construction. An example is illustrated in FIGS. 9A-9B. In this example, the processing includes attaching the die 110 to the interposer, underfilling the die (with underfill 910), and attaching a stiffener 920 (FIG. 9B) to the interposer. The die attachment is flip-chip kind, possibly using TCB (thermal compression bonding) or some other method, but non-flip-chip attachments can be used, e.g. with discrete wires interconnecting the die's contact pads 110C and the interposer's contact pads 120C.T. Further, a die can be replaced by a multichip module (MCM). While the spacer's holes 250 may weaken the spacer, the holes are arranged so that the spacer still provides adequate support for the interposer in these operations.

Underfill 910 can be any known kind, e.g. capillary or no-flow.

After the die attachment and underfilling, stiffener 920 is attached to the interposer to strengthen the assembly and, possibly, to help in cooling the die (provided that the stiffener is made of a high thermal conductivity material and/or includes an active cooling device). Stiffener 920 has a cavity 930 enclosing the die 110. If desired, the die can be encapsulated by a suitable resin (not shown) within the cavity, and/or a thermal interface material (TIM) can be placed into the cavity to help conduct heat away from the die. Other types of processing can also be performed at step 430 as noted above.

Figure 10A:
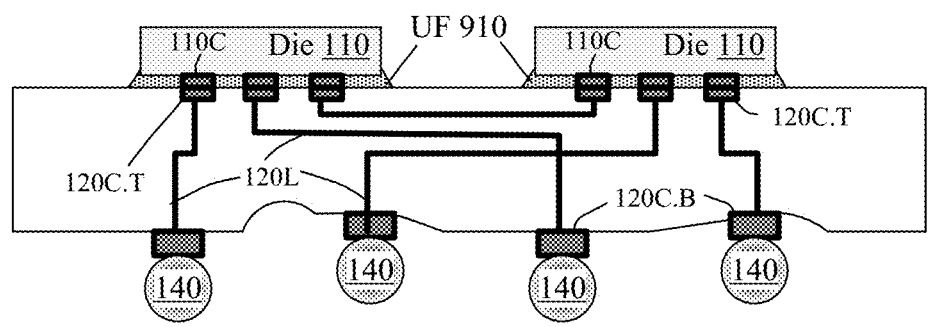
Figure 10B:
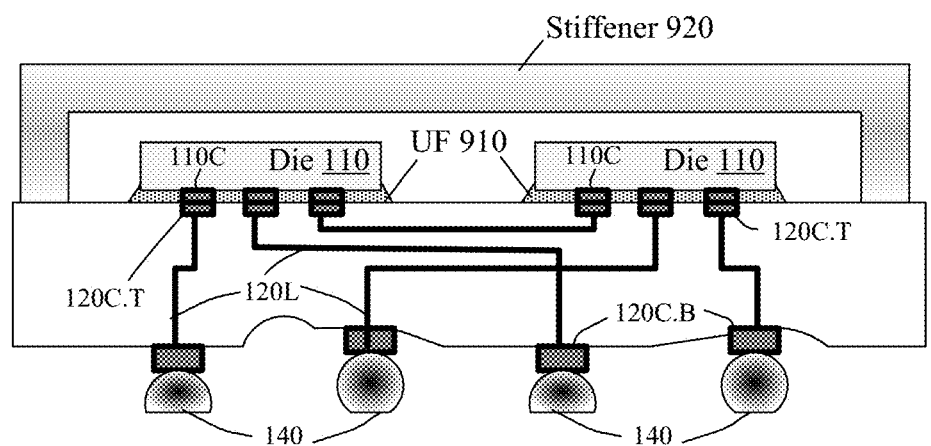

FIGS. 10A-10B illustrate subsequent processing in some embodiments. FIG. 10A shows the interposer/die/stiffener assembly after it is separated from the spacer (at step 450). In this example, when the interposer is separated from the spacer, the interposer is warped despite the anti-warping action of stiffener 920. The warpage is schematically shown in FIG. 10A by an uneven bottom surface of the interposer substrate and uneven elevations of solder balls 140, but the warpage may also affect the interposer's top surface and even the die and the stiffener. The solder balls' bottom surfaces can be made even with each other by coining; in this operation, the solder balls are softened by heat and then are slightly pressed against a horizontal surface (not shown). The resulting structure is shown in FIG. 10B.

Alternatively (or in addition), the warpage can be eliminated by forming an additional layer or layers in the interposer, e.g. on the bottom surface, as known in the art.

The structure can be processed further in any desired way. For example, if multiple structures of the kind shown in the figures are manufactured on a single interposer wafer 120, the structure can be diced (e.g. along dicing lines, not shown, passing between stiffeners 920).

Some embodiments of the invention can be defined by the following clauses:

Clause 1 defines a manufacturing method comprising:

obtaining a microelectronic workpiece (e.g. interposer 120, possibly with other components) comprising a first side (e.g. bottom side) and a second side opposite to the first side, the workpiece comprising first circuitry (e.g. comprising lines 120L, possibly with resistors, transistors, and other circuits that can be manufactured in the interposer) comprising a plurality of first conductive features (e.g. bottom contact pads 120C.B with solder balls 140, or without solder, e.g. copper posts to be attached to the die by diffusion bonding) each of which forms a protrusion on the first side;

obtaining a first structure (e.g. spacer 210) comprising a first plurality of holes;

placing the first structure between the workpiece's first side and a holding stage (e.g. 220S) of a holder so that each said protrusion enters a respective one of the holes and at least two protrusions enter respective different holes, with the first structure being in a first position relative to the workpiece;

operating the holder to create an attraction force (e.g. vacuum or electrostatic) that holds the workpiece on the first structure in the first position;

with the workpiece being in the first position, processing the second side of the workpiece (any kind of processing can be involved, not only as in FIGS. 9A-9B);

after processing the second side of the workpiece, operating the holder to diminish the attraction force (the attraction force can be reduced to zero or to a small value suitable for separating the workpiece from the spacer); and then separating the workpiece from the first structure.

Clause 2: The method of clause 1 wherein the attraction force attracts the workpiece to the holding stage and causes the workpiece to press the first structure against the holding stage.

Clause 3 defines the method of clause 1 wherein:

the first circuitry comprises one or more conductive second features (e.g. contact pads 120C.T) on the workpiece's second side; and processing the second side of the workpiece comprises:

obtaining one or more second structures (e.g. die 110) comprising second circuitry; and electrically coupling the second circuitry to the workpiece's second side thereby connecting the second circuitry to the first circuitry (the die may or may not be attached to the top side according to this clause).

Clause 4: The method of clause 3 wherein processing the second side of the workpiece further comprises attaching the one or more second structures to the workpiece's second side.

Clause 5: The method of clause 3 wherein the workpiece comprises an interposer, and the one or more second structures comprise a semiconductor integrated circuit attached to the interposer in the processing of the second side.

Clause 6: The method of clause 2 wherein the workpiece comprises an interposer, and the workpiece's first side is a side of the interposer.

Clause 7: The method of clause 1 wherein diminishing the attraction force comprises eliminating the attraction force.

Clause 8: The method of clause 1 wherein the workpiece's first side comprises one or more first surface areas between the protrusions; and when the workpiece presses the first structure to the holding stage, the workpiece exerts pressure on the first structure at each first surface area.

Clause 9: The method of clause 1 wherein a plurality of said protrusions enter one of the holes in the first position.

Clause 10: The method of clause 1 wherein:

the first plurality of holes comprises one or more through-holes;

the holder comprises a vacuum mechanism (e.g. the pump 220P and holes 220H); and the attraction force is provided by the vacuum mechanism reducing pressure in the one or more through-holes and thus creating a negative pressure difference between the one or more through-holes and the workpiece's second side.

Clause 11: The method of clause 10 wherein the first plurality of holes further comprises one or more holes that are not through-holes.

Clause 12: The method of clause 11 wherein a plurality of said protrusions enter one of the one or more through-holes in the first position.

Clause 13: The method of clause 12 wherein there are more protrusions entering the one of the one or more through-holes than there are protrusions entering at least one said hole which is not a through-hole. For example, in FIG. 6B, there are three protrusions 140 entering a through-hole 250D but only one protrusion entering a hole 250 which is not a through-hole.

Clause 14: The method of clause 1 wherein the attraction force provides a required force in order to hold the workpiece in the first position while attaching at least part of the one or more second structures to the workpiece's second side. Thus, the workpiece could not be held in the first position during the attachment if the attraction force were removed with all the other forces (e.g. gravitation) being the same.

The invention is not limited to the embodiments described above, and in particular is not limited to interposers thin enough to warp, or to stiffeners. or other features, except as defined in the appended claims. Other embodiments and variations are within the scope of the invention, as defined by the appended claims.

The invention claimed is:

1. A manufacturing method comprising:
   obtaining a microelectronic workpiece comprising a first side and a second side opposite to the first side, the workpiece comprising first circuitry comprising a plurality of first conductive features each of which forms a protrusion on the first side;
   obtaining a first structure comprising a first plurality of holes;
   placing the first structure between the workpiece's first side and a holding stage of a holder so that each of said protrusions enters a respective one of the holes and at least two protrusions enter respective different holes, with the first structure being in a first position relative to the workpiece without being bonded to the first structure;
   operating the holder to create an attraction force that holds the workpiece on the first structure in the first position without separately bonding the workpiece to the first structure;
   with the workpiece being in the first position, processing the second side of the workpiece;
   after processing the second side of the workpiece, operating the holder to diminish the attraction force; and then
   separating the workpiece from the first structure.

2. The method of claim 1 wherein the attraction force attracts the workpiece to the holding stage and causes the workpiece to press the first structure against the holding stage.

3. The method of claim 1 wherein diminishing the attraction force comprises eliminating the attraction force.

4. The method of claim 1 wherein the workpiece's first side comprises one or more first surface areas between the protrusions; and
   when the workpiece presses the first structure to the holding stage, the workpiece exerts pressure on the first structure at each first surface area.

5. The method of claim 1 wherein:
   the first plurality of holes comprises one or more through-holes;
   the holder comprises a vacuum mechanism; and
   the attraction force is provided by the vacuum mechanism reducing pressure in the one or more through-holes and thus creating a negative pressure difference between the one or more through-holes and the workpiece's second side.

6. The method of claim 1 wherein placing the first structure between the workpiece's first side and the holding stage comprises:
   placing the first structure on the holding stage; and then
   placing the workpiece on the first structure.

7. The method of claim 6 wherein the holder comprises a holding mechanism holding the first structure on the holding stage at least before placing the workpiece on the first structure.

8. The method of claim 6 wherein before placing the workpiece on the first structure, the first structure is held on the holding stage by vacuum without any additional, separately activated mechanism to hold the first structure on the holding stage.

9. The method of claim 1 wherein separating the workpiece from the first structure is performed while the first structure remains on the holding stage.

10. The method of claim 9 further comprising, after separating the workpiece from the first structure, removing the first structure from the holding stage.

11. A manufacturing method comprising:
    obtaining a microelectronic workpiece comprising a first side and a second side opposite to the first side, the workpiece comprising first circuitry comprising a plurality of first conductive features each of which forms a protrusion on the first side;
    obtaining a first structure comprising a first plurality of holes;
    placing the first structure between the workpiece's first side and a holding stage of a holder so that each of said protrusions enters a respective one of the holes and at least two protrusions enter respective different holes, with the first structure being in a first position relative to the workpiece;
    operating the holder to create an attraction force that holds the workpiece on the first structure in the first position;
    with the workpiece being in the first position, processing the second side of the workpiece;
    after processing the second side of the workpiece, operating the holder to diminish the attraction force; and then
    separating the workpiece from the first structure;
    wherein:
    the first circuitry comprises one or more conductive second features on the workpiece's second side; and
    processing the second side of the workpiece comprises:
    obtaining one or more second structures comprising second circuitry; and
    electrically coupling the second circuitry to the workpiece's second side thereby connecting the second circuitry to the first circuitry.

12. The method of claim 11 wherein processing the second side of the workpiece further comprises attaching the one or more second structures to the workpiece's second side.

13. The method of claim 11 wherein the workpiece comprises an interposer, and the one or more second structures comprise a semiconductor integrated circuit attached to the interposer in the processing of the second side.

14. The method of claim 11 wherein the workpiece comprises an interposer, and the workpiece's first side is a side of the interposer.

15. The method of claim 11 wherein the attraction force provides a required force in order to hold the workpiece in the first position while attaching at least part of the one or more second structures to the workpiece's second side.

16. A manufacturing method comprising:
    obtaining a microelectronic workpiece comprising a first side and a second side opposite to the first side, the workpiece comprising first circuitry comprising a plurality of first conductive features each of which forms a protrusion on the first side;
    obtaining a first structure comprising a first plurality of holes;
    placing the first structure between the workpiece's first side and a holding stage of a holder so that each of said protrusions enters a respective one of the holes and at least two protrusions enter respective different holes, with the first structure being in a first position relative to the workpiece;
    operating the holder to create an attraction force that holds the workpiece on the first structure in the first position;
    with the workpiece being in the first position, processing the second side of the workpiece;

after processing the second side of the workpiece, operating the holder to diminish the attraction force; and then separating the workpiece from the first structure;

wherein a plurality of said protrusions enter one of the holes in the first position.

17. A manufacturing method comprising:

obtaining a microelectronic workpiece comprising a first side and a second side opposite to the first side, the workpiece comprising first circuitry comprising a plurality of first conductive features each of which forms a protrusion on the first side;

obtaining a first structure comprising a first plurality of holes;

placing the first structure between the workpiece's first side and a holding stage of a holder so that each of said protrusions enters a respective one of the holes and at least two protrusions enter respective different holes, with the first structure being in a first position relative to the workpiece;

operating the holder to create an attraction force that holds the workpiece on the first structure in the first position;

with the workpiece being in the first position, processing the second side of the workpiece;

after processing the second side of the workpiece, operating the holder to diminish the attraction force; and then separating the workpiece from the first structure;

wherein:

the first plurality of holes comprises one or more through-holes;

the holder comprises a vacuum mechanism; and the attraction force is provided by the vacuum mechanism reducing pressure in the one or more through-holes and thus creating a negative pressure difference between the one or more through-holes and the workpiece's second side;

wherein the first plurality of holes further comprises one or more holes that are not through-holes.

18. The method of claim 17 wherein a plurality of said protrusions enter one of the one or more through-holes in the first position.

19. The method of claim 18 wherein there are more protrusions entering the one of the one or more through-holes than there are protrusions entering at least one said hole which is not a through-hole.

* * * * *